United States Patent [19]

Marx

[11] Patent Number: 5,439,500
[45] Date of Patent: Aug. 8, 1995

[54] MAGNETO-OPTICAL ALLOY SPUTTER TARGETS

[75] Inventor: Daniel R. Marx, West Caldwell, N.J.

[73] Assignee: Materials Research Corporation, Orangeburg, N.Y.

[21] Appl. No.: 161,143

[22] Filed: Dec. 2, 1993

[51] Int. Cl.⁶ .............. C22C 19/00; C22C 38/00; B22F 3/12
[52] U.S. Cl. ............... 75/246; 419/32; 419/39; 419/48; 419/56
[58] Field of Search ........... 75/245, 246; 419/32, 419/39, 48, 56

[56] References Cited

U.S. PATENT DOCUMENTS

| | | | |
|---|---|---|---|
| 3,615,911 | 10/1971 | Nesbitt et al. | 148/31.57 |
| 3,856,579 | 12/1974 | Allen et al. | 148/103 |
| 4,367,257 | 1/1983 | Arai et al. | 428/220 |
| 4,620,872 | 11/1986 | Hijikata et al. | 75/246 |
| 4,735,698 | 4/1988 | Nomura et al. | 204/192.2 |
| 4,803,046 | 2/1989 | Hausselt et al. | 420/83 |
| 4,814,053 | 3/1989 | Shimokawato | 204/192.15 |
| 4,824,481 | 4/1989 | Chatterjee et al. | 95/24.6 |
| 4,832,980 | 5/1989 | Ichihara et al. | 427/38 |
| 4,885,134 | 12/1989 | Hatwar | 420/416 |
| 4,915,737 | 4/1990 | Morimoto et al. | 75/246 |
| 4,915,738 | 4/1990 | Morimoto et al. | 75/246 |
| 4,927,513 | 5/1990 | Schultheiss et al. | 75/246 |
| 4,933,059 | 6/1990 | Sugawara et al. | 204/192.15 |
| 4,946,501 | 8/1990 | Nate et al. | 75/246 |
| 4,957,549 | 9/1990 | Matsumoto et al. | 75/246 |
| 4,992,095 | 2/1991 | Nate et al. | 75/246 |
| 5,062,885 | 11/1991 | Matsumoto et al. | 75/255 |
| 5,098,649 | 3/1992 | Matsumoto et al. | 419/48 |
| 5,135,819 | 8/1992 | Ito et al. | 428/694 |

FOREIGN PATENT DOCUMENTS

| | | |
|---|---|---|
| 3738738 | 1/1989 | Germany . |
| 60-230903 | 11/1985 | Japan . |
| 62-70550 | 4/1987 | Japan . |

Primary Examiner—Ngoclan Mai
Attorney, Agent, or Firm—Wood, Herron & Evans

[57] ABSTRACT

A magneto-optical sputter target having a composition comprising at least one rare earth element and at least one transition metal, with a structure which includes a transition metal constituent and a finely mixed alloy constituent of a rare earth phase and a rare earth/transition metal intermetallic compound. The structure of the present target contains a minimum of the intermetallic compound. A method of producing the present sputter target includes mixing particles of the transition metal constituent (preferably only alloyed transition metals) with particles of the finely mixed alloy to produce a powder blend and subjecting the powder blend to a pressing operation in an oxidizing inhibiting environment for a time and at a temperature and pressure which minimizes the rare earth/transition metal intermetallic compound content of the target.

28 Claims, 4 Drawing Sheets

MAGNETO-OPTICAL ALLOY SPUTTER TARGETS

FIELD OF THE INVENTION

The present invention relates to an alloy target used to manufacture a magneto-optical recording medium, and a method of making such a target.

BACKGROUND OF THE INVENTION

Magneto-optical (MO) recording media are formed by sputtering a thin layer or film composed of rare earth elements and transition metals in a desired composition onto a substrate such as a glass or plastic wafer or disc. Such MO recording media have been used for data storage and in audio reproduction applications to produce recordable compact discs (CD's). Targets used in the sputtering process are known to be made from a variety of materials and produced by a variety of methods. Various target materials and manufacturing processes can be found in U.S. Pat. Nos. 4,957,549; 4,620,872; 4,946,501; 4,915,738; and 4,992,095.

The desirability of one such sputter target material or manufacturing process over others usually depends upon the performance characteristics of the target in producing (i.e., sputtering) the layer of magneto-optical recording medium. The performance of each target is typically measured by the resulting properties of the sputtered MO film produced. These properties may include coercivity (Hc), coercivity uniformity, write (external field) bias sensitivity, carrier (signal) to noise ratio (C/N ratio), and block error rate. The desired properties of the MO film are likely to change from one application to another. For example, a MO film may exhibit a coercivity (Hc) level which is too high or too low for some applications and just right for other applications. While the coercivity desired for a given MO film may vary, in general, it is desirable for the coercivity to be kept high and the coercivity uniformity kept low. In addition, it is generally desirable for a given MO film to exhibit a high C/N ratio and to maintain a desired block error rate at as low a read laser power level as possible. It is also desirable for such sputter targets to have low oxygen contents. For manufacturing cost effectiveness, it may also be important for the targets to sputter with high deposition rates at low plasma impedances.

The magneto-optical recording medium industry is very competitive. Extensive amounts of research and development resources have been and are being expended in a continuous effort to better understand the relationship between sputter target materials and manufacturing processes on one hand and the desired properties of the resulting magneto-optical recording medium on the other. Even so, there is still a need for alternative materials and manufacturing processes for making sputter targets which enable higher quality MO films to be consistently produced. The present invention significantly contributes to this effort.

SUMMARY OF THE INVENTION

The present invention is directed to a sputter target with improved performance characteristics. More particularly, the present invention is directed to a target capable of consistently sputtering a layer of magneto-optical recording medium having improved properties. The present invention is also directed to a method of making such MO sputter targets in which the structure of the resulting target may be better controlled and thereby enable MO films sputtered therefrom to be consistently produced with the improved properties desired.

The sputter targets of the present invention have a composition comprising at least one rare earth element and at least one transition metal. Each of the present targets has a structure with a plurality of constituents including a transition metal constituent and a finely mixed alloy constituent of a rare earth phase and a rare earth/transition metal (RE/TM) intermetallic compound. While actual sample targets were made with the terbium-iron eutectic alloy (TbFe12), it is believed that satisfactory results may also be produced by using other finely mixed alloys, such as those formed by peritectic or peritectoeutectic reactions, etc. It is believed that optimum results may be attained if the rare earth content of the finely mixed alloy is kept high, for example by using a hypereutectic Tb—Fe alloy (i.e., having a rare earth matrix) rather than a hypoeutectic Tb—Fe alloy (i.e., having an intermetallic compound matrix). Therefore, from here after, references to the target structure including an eutectic alloy will be understood as not excluding other such finely mixed alloys found to be acceptable. Preferably, the transition metal constituent is a transition metal alloy. It may be desirable for the present target structure to include more than one transition metal alloy in order to reach the target and MO film composition desired. The target structure may include various transition metal/transition metal alloys, alloys of a transition metal and a corrosion resistance improving element, or a combination of both.

It has been discovered that by limiting the amount of rare earth/transition metal intermetallic compound present in its structure, the target is more likely to consistently sputter MO films with improved properties. The structure of the present target is preferably substantially free of any unalloyed or elemental transition metal, in order to limit the formation of such intermetallic compounds during the target production process. Unalloyed transition metals, such as Fe, are very reactive and tend to form intermetallic compounds with rare earth elements, such as Tb, during production of the target. While reducing the amount of RE/TM intermetallic compound present is desirable, it is also desirable for a certain amount of the intermetallic compound to be present during the target manufacturing process in order to help control the oxygen content of the target. Too much oxygen in the target adversely effects target performance.

In one method of producing the present targets, the various constituents of the desired target structure are provided in particle form and mixed together into a powder blend. This powder blend is then subjected to a consolidation operation in an oxidizing inhibiting environment, for example, hot isostatic pressing, vacuum hot pressing, inert gas hot pressing, and the like. During the consolidation process, the particles making up the target structure are bonded together along a bonding or diffusion interface, such as by pressure sintering. In order to further limit the RE/TM intermetallic compound content of the target and thereby improve target performance and the properties of the resulting MO film, the formation of such intermetallic compounds as a diffusion product in the diffusion interface may also be avoided. Target structures free, or at least substantially free, of such intermetallic compound diffusion products may be produced by avoiding the use of unalloyed transition metal powders in the powder blend, varying the consolidation temperature and/or varying the time at temperature during consolidation of the target. Thus, the final RE/TM intermetallic compound content of the target, and therefore the properties of the resulting MO film, may be controlled by minimizing the intermetallic compound content of the powder blend and/or varying the process used for consolidating the powder blend into the target. MO films with consistently higher coercivity values have been sputtered from exemplary targets produced using powder blends substantially free of any unalloyed transition metal particles, with the powder blends being consolidated at a variety of temperatures and/or times at temperature.

The RE/TM intermetallic compound content of the target structure may be varied and additional improvements in target performance obtained by rare earth enrichment of the rare earth containing regions in the target structure. This rare earth enrichment of the target may be accomplished by making additions of substantially elemental rare earth (RE) particles to the basic powder blend of the present invention, thereby increasing the rare earth content of the target structure, reducing the RE/TM intermetallic compound content of the target and increasing the rare earth yield in the resulting MO film. It is believed that rare earth/rare earth (RE/RE) alloy particles (i.e., alloys containing substantially only rare earth elements) may be used instead of or along with the elemental RE particles to produce such an effect. In addition, reducing the temperature and/or time at temperature during the consolidation operation not only limits the formation of the RE/TM intermetallic compound diffusion products, it also reduces alloying of the elemental RE or RE/RE alloy particles with non-rare earth elements due to diffusion, thereby increasing the amount of undiluted rare earth metal (i.e., not in solid solution with a non-rare earth element) present in the target and adding to the associated improvement in target performance and the properties of the MO film.

Thus, it has been found that the properties of a sputtered layer of magneto-optical recording medium, in particular its coercivity, may be consistently controlled and tailored by varying the target composition and/or manufacturing process according to the principles of the present invention as described herein. The principles of the present invention, its objectives and advantages will be further understood with reference to the following detailed description.

DETAILED DESCRIPTION OF THE INVENTION

Figure 1:
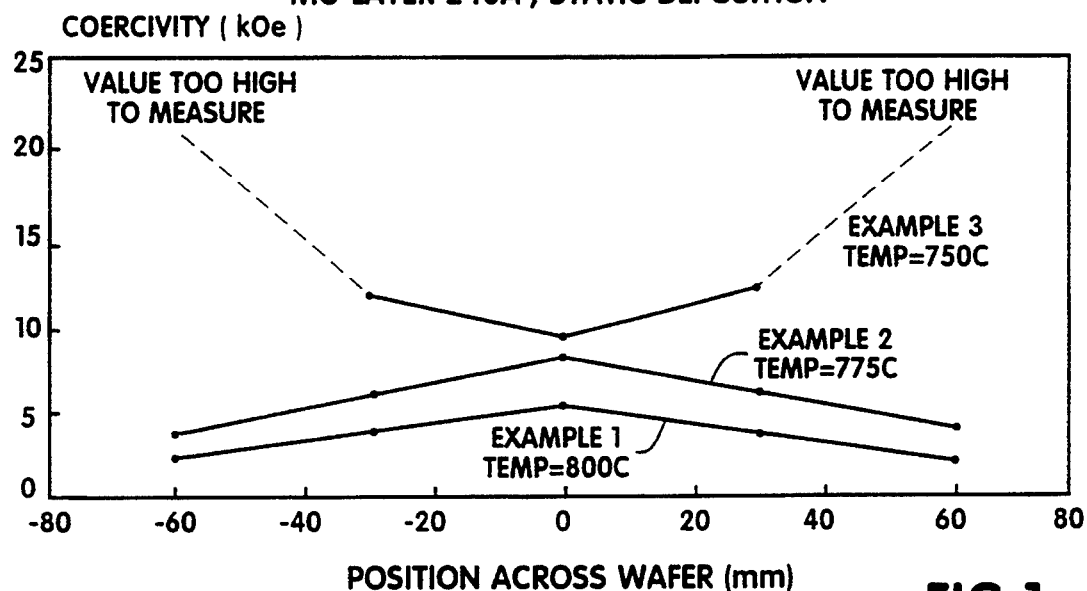
FIG. 1 is a graph of the coercivity across MO alloy films sputtered from Examples 1, 2 and 3.

Films or layers of a magneto-optical recording medium having improved properties may be more consistently sputter coated onto a substrate from targets incorporating the principles of the present invention. The present sputter targets each have a composition which includes at least one rare earth element, which may range from about 10 to about 50 atomic percent, and preferably ranges from about 15 to about 25 atomic percent. The composition further includes at least one transition metal, typically a substantial portion of the balance. While exemplary sputter targets have been manufactured with the rare earth terbium (Tb) and the transition metals iron (Fe) and cobalt (Co), it is believed that high performance sputter targets incorporating the principles of the present invention may also be produced from other rare earth elements, including samarium (Sm), neodymium (Nd), gadolinium (Gd), dysprosium (Dy), holmium (Ho), thulium (Tm) and erbium (Er), etc., as well as other transition metals, including nickel (Ni), etc. Preferably, the composition of the present targets also includes at least one corrosion resistance improving element. Again, while exemplary targets have been successfully manufactured with the corrosion inhibiting element chromium (Cr), it is believed that other corrosion inhibiting elements may be acceptable, including titanium (Ti), hafnium (Hf), zirconium (Zr), aluminum (Al), copper (Cu), niobium (Nb), tantalum (Ta), palladium (Pd), molybdenum (Mo), vanadium (V) and platinum (Pt).

In one preferred embodiment of the present invention, each target has a structure with a plurality of constituents including a transition metal alloy and a finely mixed alloy of a rare earth phase and a rare earth/transition metal (RE/TM) intermetallic compound, such as a rare earth and transition metal eutectic alloy. The transition metal alloy may be, for example, a transition metal/transition metal alloy or a transition metal/corrosion resistant element alloy. Preferably, the target structure also includes an elemental rare earth constituent and substantially no unalloyed transition metal. It may be desirable for the target structure to include a RE/RE alloy constituent in addition to or in place of the elemental RE constituent.

Targets used to sputter coat MO films are typically manufactured using powdered metallurgy techniques. In general, such techniques include providing each target structure constituent in powder form. Following good powdered metallurgy practice, the particles of each powdered constituent are preferably metallurgically similar in shape. Spherically shaped particles have been used successfully; however, other particle shapes may also be acceptable. Spherically shaped powders may be obtained by using standard inert gas atomization techniques, such as one of the rapid quenching treatments disclosed in U.S. Pat. No. 5,098,649 which is incorporated herein by reference in its entirety. Powder sizes of less than about 500 microns have been found acceptable. Particle sizes below about 250 microns, with a mean size within the range of about 80 to about 130 microns, have been found preferable for producing targets having better aesthetic qualities.

The various powdered constituents are mixed to form a powder blend by sealing the various powdered constituents in a cylindrical container having a dry and oxygen-free argon atmosphere and rotating the container about its central axis in accordance with well known powder blending techniques. To promote uniform blending of the powder, hexane is preferably added to the powdered constituents, in a drop-wise fashion, before blending. Satisfactory results have been obtained by using two milliliters of hexane for each kilogram of total powder. It is believed that other high molecular weight alkanes, such as heptane and possibly octane, may also be used to aid in the blending process. It is best to choose the composition of each powdered constituent to enable blending of various amounts of the constituents into a range of target compositions (see Table I).

The powder blend is then consolidated into the desired target shape by sintering the powder particles together, preferably in a vacuum or an inert gas atmosphere. Consolidation of the powder blend into the finished sputter target may be achieved by various well-known pressing techniques, such as inert gas uniaxial hot pressing, vacuum hot pressing and hot isostatic pressing, with a graphite die set. Finished sputter targets have a density of greater than about 90% and preferably at least about 95% of theoretical density. Increasing the target density typically results in higher mechanical integrity of the target, a shorter time for evacuating the sputtering chamber, a shorter burn-in time, and less particulate generation from the target during sputtering.

The presence of rare earth/transition metal intermetallic compounds in the sputter target is avoided as much as possible. It is believed that for some applications the targets may contain up to a maximum of about 15% by weight of such RE/TM intermetallic compounds and still produce MO films having improved properties compared to films sputtered from prior MO targets. It is also believed that for other applications a RE/TM intermetallic compound content of up to about 10% by weight may be appropriate. For optimum results, it is believed that the RE/TM intermetallic compound content of the present targets may range up to about 5% by weight. It has been found that by minimizing the amount of such RE/TM intermetallic compounds present in the sputter target, the yield of elemental rare earth metal deposited onto the substrate during the sputter coating process, and thereby properties of the resulting MO film, is improved. Thus, it is desirable for powders of alloyed, not elemental, transition metals to be used in the powder blend. That is, there is not enough unalloyed transition metal present to react and form a significant amount of RE/TM intermetallic compound diffusion product during the target consolidation process. Instead, the transition metals are alloyed with another element which is capable of tying up and preventing the transition metal from reacting (i.e., forming an intermetallic compound) with any rare earth metal during the consolidation operation. The formation of these intermetallic compounds can be prevented or at least substantially limited by controlling the target consolidation process itself, as well as by eliminating unalloyed transition metal powders in the powder blend.

When the powder blend is consolidated to form the target, the powder particles become interconnected and joined along a diffusion or bonding interface. By minimizing the consolidation temperature and/or the time at temperature during the pressing operation, the formation of a RE/TM intermetallic compound diffusion product within the bonding interface may be avoided or at least significantly limited. That is, this diffusion product is limited to the point that the powder particles are held together by metallic solid solution bonding (through the melding of atomic lattices), not intermetallic bonding (through the formation of an incoherent precipitate layer). If any RE/TM intermetallic compound does form as a diffusion product, it is a random occurrence, typically a dispersion of noncontinuous intermetallic compound precipitates along the bonding interface and not a layer (i.e., not a continuous or semi-continuous film). In addition, by minimizing the consolidation temperature and/or the time at temperature, dilution of any elemental RE or RE/RE alloy constituent present in the target may be limited. In this way, the final structure of the target, and thereby the properties of the sputtered MO film, may be consistently controlled. The enhanced performance of the present target may be clearly seen as a function of the coercivity of the sputtered MO film (see FIGS. 1, 3, 4 and 6).

For a given target composition, it is believed that at low levels (less than about 2,000 ppm) the oxygen content of the target does not play as significant a role in determining the target performance as the rare earth/transition metal intermetallic compound content of the target. Even so, the oxygen content of the target is still important. It appears that the optimum oxygen level in the present target is within the range of about 500 ppm to about 2,000 ppm. It is believed that using powder blends having a calculated oxygen content within the range of about 300 ppm to about 1,200 ppm will produce such an optimum target oxygen level. To obtain such a powder blend oxygen level, it is suggested that the oxygen content of any elemental rare earth powder be less than about 2,000 ppm and preferably less than about 1,000 ppm. It is believed that any RE/RE alloy powder used should have about the same oxygen content. It is also suggested that the content of the eutectic powder be less than about 1,000 ppm and preferably less than about 800 ppm, and the content of the transition metal alloy powder be less than about 800 ppm and preferably less than about 500 ppm.

The principles of the present invention are illustrated by the following eleven examples of target samples and sputtering results, without, however, being limited thereto. Three basic directions were taken with these examples to illustrate the effects of the composition and manufacturing process on the target microstructure and sputtering performance, and ultimately the properties of the MO film. Examples 1–5 illustrate the impact of the consolidation temperature on the performance characteristics of the target. Examples 6 and 7 illustrate the affect that the time at temperature has on the target performance. And, examples 8–11 illustrate how proper selection of the composition of the powdered phases affects the target performance. Because it is a relatively easy property to measure, the coercivity (Hc) of the MO films sputtered from these exemplary targets was used to compare the performance of the various targets. However, it is believed that other properties (see preceding discussion) of MO films sputtered from targets produced according to the principles of the present invention may also exhibit improvements.

EXAMPLE 1, 2 and 3

Figure 2:
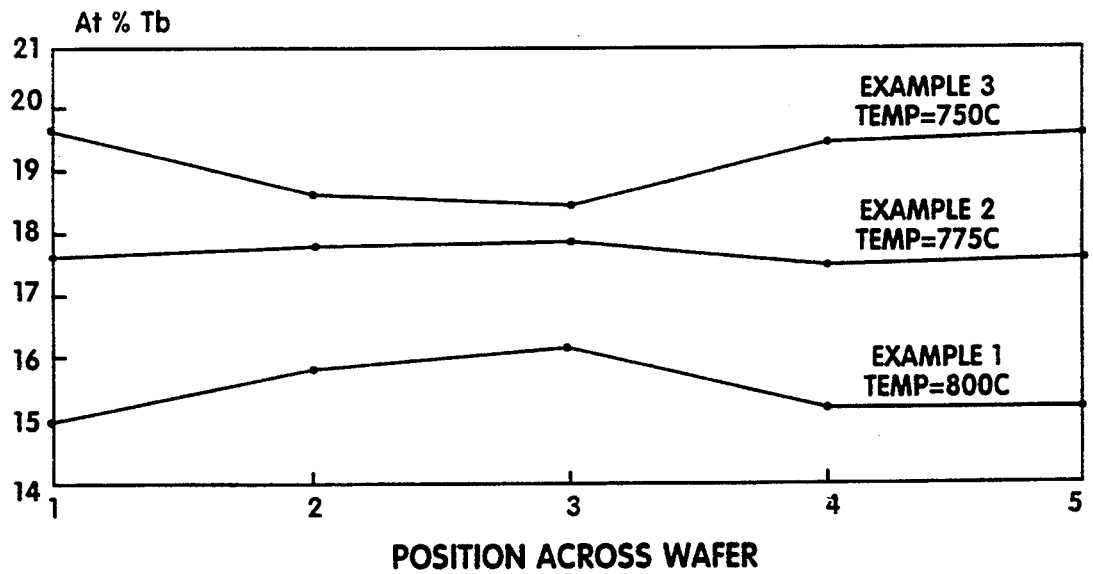
FIG. 2 is a graph of the Tb content across MO alloy films sputtered from the targets of Examples 1, 2 and 3 as measured by Rutherford Backscattering Spectroscopy (RBS)

Referring to Tables I–III and FIGS. 1 and 2, Examples 1–3 illustrate the impact that the consolidation temperature has on the sputter target performance. In particular, Fe/Tb19/Cr6/Co6 (in atomic percent) MO alloy sputter targets, with elemental Tb and the TbFe12 eutectic as the source of the rare earth, were used to illustrate the effect of pressing temperature on the film Tb yield and film coercivity (Hc). The powdered constituents used in these examples, along with the powder blend charge ratio of each, may be found in Table I. The powder blend for each example was pressed into the respective target using a uniaxial inert gas hot press, the structure and operation of which forms no part of this invention and is therefore not discussed in detail herein. The hot pressing conditions for each example can be found in Table II. The pressing temperature and time at temperature will likely depend upon the particular type of press used. MO films sputtered from these exemplary targets were deposited on 150 mm diameter oxide coated silicon wafers at 3 kW and 3 mTorr using a static deposition sputtering system, the structure and operation of which forms no part of this invention and therefore is also not discussed in detail herein. It is believed that satisfactory results could be obtained using any such sputtering system by following well-known sputtering techniques for optimizing target performance and the properties of the resulting MO film. Each of the resulting MO wafers included an Al reflective layer and two layers of $Si_3N_4$ sandwiching the MO alloy layer as is commonly done. For the MO wafers used in these examples and all of the other examples, the thicknesses of the Al and $Si_3N_4$ layers were kept constant. It is known that variations in these thicknesses may impact the final properties of the MO film. However, this aspect of MO film production forms no part of this invention and is therefore not discussed in detail herein. As can be seen from FIGS. 1 and 2, as the pressing temperature decreases, there is an increase in the MO film coercivity and a corresponding increase in the film Tb content. The film Tb content was measured at five equally spaced positions across a 150 mm diameter wafer by evaluating 2000 Å thick MO alloy layers using Rutherford Backscattering Spectroscopy (RBS).

Examples 1–3 show that as the pressing temperature is reduced, the coercivity increases and the Tb yield in the MO films increases (see FIGS. 1 & 2 respectively). Metallographic analysis of the exemplary MO target microstructures revealed that the amount of rare earth/transition metal intermetallic compound formed as a diffusion product in the bonding layer between the particles decreases as the pressing temperature is reduced. Optical inspection of the MO target microstructures also revealed that the amount of the intermetallic compound present as a diffusion product is virtually eliminated at the low temperature of Example 3, with only trace amounts of noncontacting intermetallic compound precipitates present. A second result of this discovery is that as the pressing temperature is lowered, more of the originally elemental Tb particles present in the powder blend remains undiluted (i.e., is not in the form of a solid solution) in the target. It is the presence of the undiluted elemental Tb which is believed to further improve the Tb sputter yield from the target.

As can be seen in FIG. 2, the Tb concentration profile actually inverts when the MO film is sputtered from the target of Example 3 (i.e., at the lowest pressing temperature). Thus, the rare earth concentration profile in the MO film may be controlled by varying the powder blend consolidation process (see Table II).

EXAMPLES 4 and 5

Figure 3:
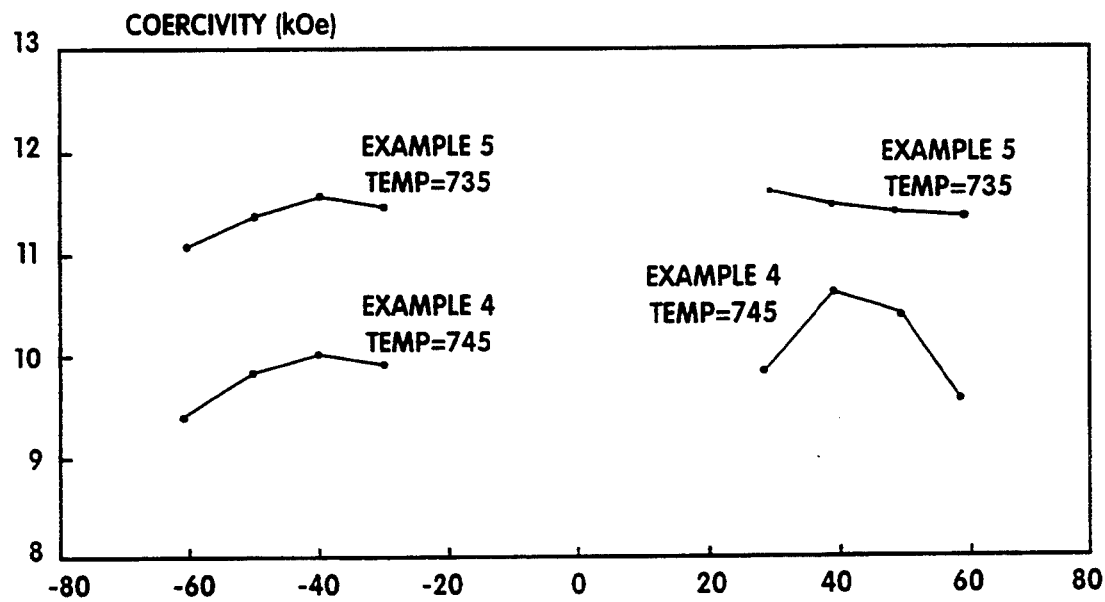
FIG. 3 is a graph of the coercivity across portions of MO alloy films sputtered from the targets of Examples 4 and 5.

Referring to Tables I, II and IVa and to FIG. 3, Examples 4 and 5 not only illustrate the impact that the pressing temperature has on the target performance but also shows that by increasing the pressure used in forming the target, even lower consolidation temperatures are possible while maintaining acceptable target densities. In these examples, Fe/Tb20/Cr6/Co6 (atomic %) MO alloy targets were used. The powdered phases used in these examples, along with the powder blend charge ratio of each, may be found in Table I. The powder blend for each example was pressed into the respective target using an uniaxial inert gas hot press. The hot pressing conditions for each example can be found in Table II. While both presses were uniaxial inert gas hot presses, the heating method was changed from induction heating for Examples 1–3 to resistance heating for the targets of Examples 4 and 5, with no apparent affect on the test results. MO films were sputtered from the Example 4 and 5 targets onto 5.25 inch (133.35 mm) diameter outgassed polycarbonate discs with a sputtering system utilizing a scanning pallet, rather than a static pallet. The magnitude of the MO film's coercivity may drop when using a scanning as opposed to a static system. However, it is believed that the basic trend evidenced by the present test results will remain the same. As in the previous examples, these films were deposited at 3 kW and 3 mTorr. Under the applicable pressing conditions shown in Table II, it is apparent that reducing the pressing temperature from 745° C. to 735° C. produces an increase in film coercivity of more than one kOe.

EXAMPLES 6 and 7

Figure 4:
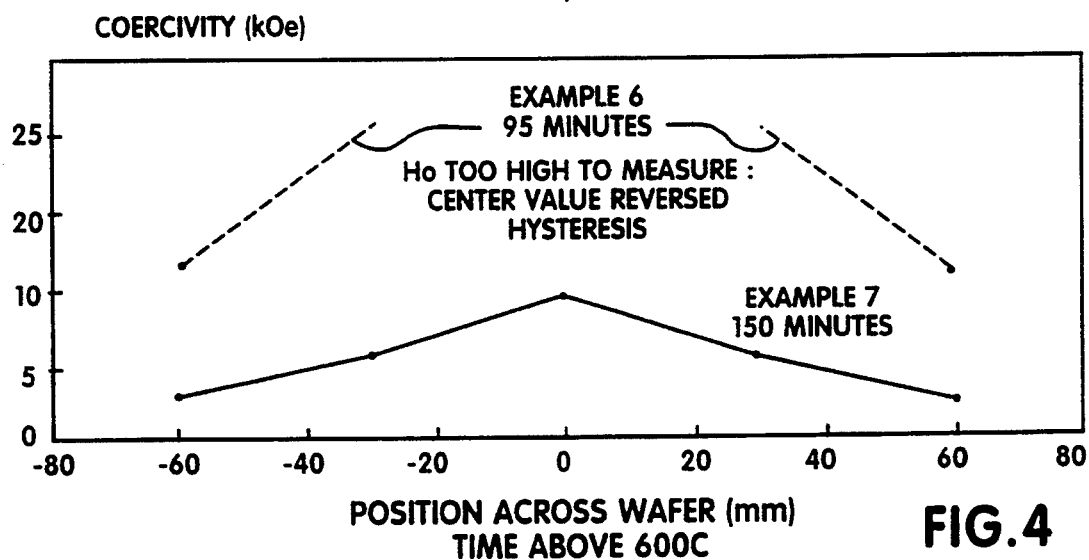
FIG. 4 is a graph of the coercivity across MO alloy films sputtered from the targets of Examples 6 and 7.
Figure 5:
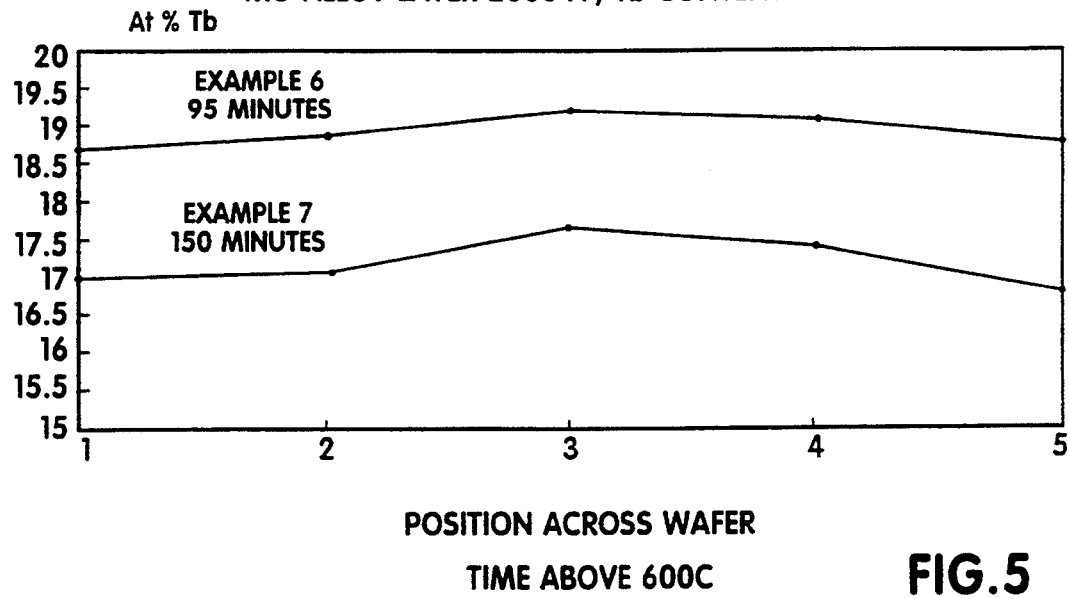
FIG. 5 is a graph of the Tb content across MO alloy films sputtered from the targets of Examples 6 and 7 as measured by RBS.

Referring to Tables I–III and FIGS. 4 and 5, in Examples 6 and 7, Fe/Tb19.5/Cr6/Co6 (atomic %) MO alloy targets were compared to illustrate the effect that the duration of the pressing operation at temperature has on target performance. Each target was formed using a uniaxial inert gas hot press, with inductive heating. For these examples, rather than the time at temperature above 600° C. being held constant at 110 minutes as in the preceding examples, the time at temperatures above 600° C. was monitored. The base line of 600° C. was chosen as a temperature above which volume diffusion and intermetallic compound formation rates were believed to become significant. The MO films were deposited onto 150 mm diameter oxide-coated silicon wafers at 3 kW and 3 mTorr using a static deposition sputtering system. As can be seen from FIGS. 4 & 5 and Table III, there is an increase in the film coercivity and a corresponding increase in the film Tb content as the time at the pressing temperature decreases. The Tb content of these exemplary MO films was measured at five equally spaced positions across the wafer diameter by evaluating 2,000 Å thick MO alloy layers using RBS.

The results from Examples 6 and 7 indicate that for a given powder blend, consolidation temperature and applied load (i.e., pressure), the film coercivity and Tb content increases as the time at temperature above 600° C. is decreased. A metallographic examination of each MO target revealed that the amount of rare earth/transition metal intermetallic compound formed in the diffusion bonding layer between phase particles decreased as the time at temperature decreased. In addition, the elemental Tb constituent of the Example 6 target remained relatively undiluted compared to that of the Example 7 target which had a longer time at temperature.

EXAMPLES 8, 9, 10 and 11

Figure 6:
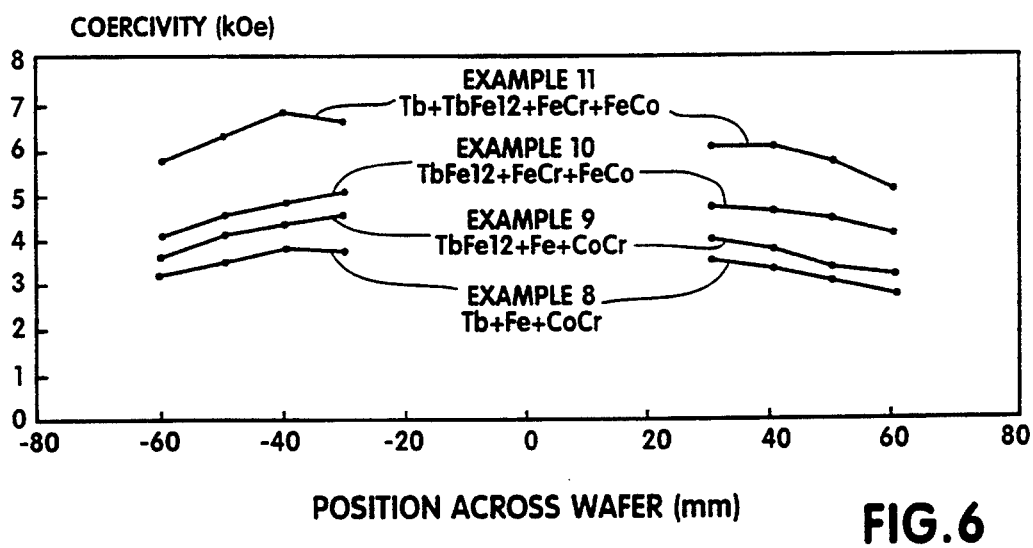
FIG. 6 is a graph of the coercivity across portions of MO alloy films sputtered from the targets of Examples 8, 9, 10 and 11.
Figure 7:
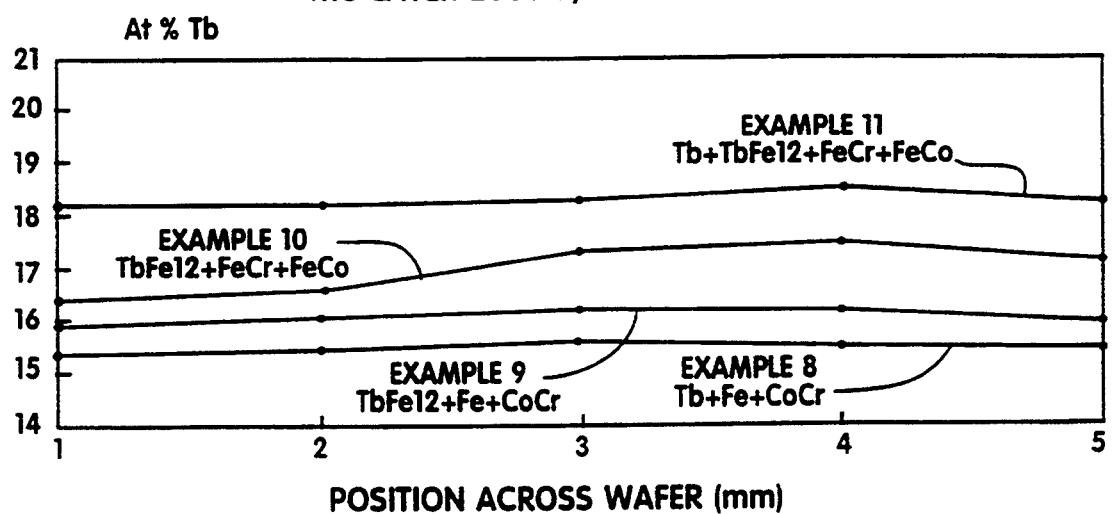
FIG. 7 is a graph of the Tb content across MO alloy films sputtered from the targets of Examples 8, 9, 10 and 11 as measured by RBS.

Referring to Tables I, II and IVa & b and FIGS. 6 and 7, Examples 8–11 demonstrate the value of selecting the powdered phases in order to optimize the target performance and the MO film properties. Such optimum target performance was obtained by eliminating elemental and only using alloyed transition metal powder in the powder blend (see Examples 10 and 11). This was done because of the belief that the reactivity between the elemental Tb and the transition metals, especially elemental Fe, leads to the formation of intermetallic compounds during the consolidation cycle. No elemental Tb powder was used in the Example 10 target. The Tb content of this target came from its TbFe12 eutectic constituent. The intermetallic compound content of the target may be further controlled by utilizing additional amounts of the elemental Tb powder in place of the TbFe12 eutectic powder as the source of rare earth for the MO film. About a 2:1 ratio of Tb to TbFe12 was used with satisfactory results (see the results of Example 11). The intermetallic compound content of the Example 10 target was less than about 15% by weight (approximately 12.8 wt %). The intermetallic compound content of the Example 11 target was less than about 5% by weight (approximately 3.9 wt %). Note that the TbFe12 eutectic is a two-phase material, with approximately 29% by weight of the eutectic being the $Fe_2Tb$ intermetallic compound.

Four Fe/Tb18.2/Cr6/Co6 (atomic %) MO alloy targets were formed using an uniaxial inert gas hot press with induction heating (all four targets had about the same composition but different structures). The resulting MO films were each sputtered onto a 5.25 in. (133.35 mm) diameter outgassed polycarbonate disc at 2 kW and 3 mTorr using a scanning pallet sputtering system. Eliminating the elemental Fe powder from the powder blend resulted in an increase in the film coercivity and a corresponding increase in the film Tb content (see Tables IVa and b, target Examples 9 and 10). Introducing elemental Tb powder into the powder blend resulted in even higher film coercivity and Tb content (compare target Examples 10 and 11). The film Tb content was measured at five equally spaced positions across each wafer diameter by evaluating 2,000 Å thick MO alloy layers using RBS (see FIG. 7).

Examples 8–11 reveal that the coercivity and film Tb content is highest for the Example 11 target which had elemental Tb, TbFe12 eutectic and alloyed transition metal powders in its powder blend and the lowest intermetallic compound content of all the targets. The worst case was the Example 8 target in which elemental Tb and elemental Fe powders were used. Metallographic analysis of the Example 8 target revealed that considerable amounts of intermetallic compound had formed in the diffusion bonding layer during the pressing of the Example 8 target. X-ray analysis indicated that all of the elemental Tb constituents reacted to form intermetallic compound diffusion product. Though not as severe, the formation of such intermetallic compounds in the Example 9 target was also found. It is believed that this is due to the interaction between the Tb phase in the TbFe12 eutectic alloy and the elemental Fe constituents. The relatively large formation of intermetallic compound diffusion products found in the Example 8 and 9 targets was eliminated or at least significantly reduced in the Example 10 and 11 targets, by adjusting the powder blend to include only alloyed, not elemental, transition metal powders.

TABLE I

| Powdered Constituents | Powder Charge Ratios (wt. %) EXAMPLES | | | | | | |
|---|---|---|---|---|---|---|---|
| | 1–3 | 4 & 5 | 6 & 7 | 8 | 9 | 10 | 11 |
| Tb | 27.8 | 28.9 | 28.3 | 38.8 | — | — | 26.9 |
| TbFe12 | 13.9 | 14.4 | 14.2 | — | 44.1 | 44.1 | 13.5 |
| Fe | — | — | — | 52.3 | 47.0 | — | — |
| FeCr15 | 3.7 | 5.3 | 4.5 | — | — | 9.8 | 2.4 |
| FeCr10 | 35.8 | 32.8 | 34.3 | — | — | 27.2 | 38.2 |
| FeCo25 | 18.8 | 18.5 | 18.6 | — | — | 19.0 | 19.0 |
| CoCr50* | — | — | — | 8.9 | 8.9 | — | — |

*While the other alloy compositions are in wt. % the composition of the CoCr alloy is in atomic %.

TABLE II

| | Hot Pressing Conditions | | | |
|---|---|---|---|---|
| EX's | Final Pressing Temp. (°C.) | Time Above 600° C. (min.) | Pressure (Kpsi) | Density |
| 1 | 800 | 110 | 3 | 100 |
| 2 | 775 | 110 | 3 | 98 |
| 3 | 750 | 110 | 3.2 | 96 |
| 4 | 745 | 110 | 3.5 | 99 |
| 5 | 735 | 110 | 3.5 | 96 |
| 6 | 800 | 95 | 3 | 100 |
| 7 | 800 | 150 | 3 | 98 |
| 8 | 800 | 140 | 3 | 100 |
| 9 | 800 | 140 | 3 | 100 |
| 10 | 800 | 140 | 3 | 100 |
| 11 | 800 | 140 | 3 | 100 |

TABLE III

| | Hc (kOe) at Positions Across Wafer (mm) | | | | | Tb (at %) Content Across Wafer | | | | |
|---|---|---|---|---|---|---|---|---|---|---|
| Ex | −60 | −30 | 0 | 30 | 60 | 1 | 2 | 3 | 4 | 5 |
| 1 | 2.22 | 3.67 | 5.3 | 3.45 | 2 | 15 | 15.8 | 16.1 | 15.2 | 15.2 |
| 2 | 3.71 | 5.84 | 8.3 | 5.99 | 3.83 | 17.6 | 17.8 | 17.9 | 17.5 | 17.6 |
| 3 | ** | 11.8 | 9.5 | 12.1 | ** | 19.6 | 18.6 | 18.5 | 19.4 | 19.6 |
| 6 | 11.7 | ** | ** | ** | 11.7 | 18.7 | 18.9 | 19.2 | 19.1 | 18.8 |
| 7 | 3 | 6 | 9.8 | 6.1 | 3.3 | 17 | 17.1 | 17.7 | 17.4 | 16.8 |

**Hc value was too high to measure, >20 kOe

TABLE IVa

| | HC(kOe) at Positions Across Wafer (mm) | | | | | | | |
|---|---|---|---|---|---|---|---|---|
| Ex | −60 | −50 | −40 | −30 | 30 | 40 | 50 | 60 |
| 4 | 9.47 | 9.86 | 10.02 | 9.9 | 9.81 | 10.56 | 10.4 | 9.48 |
| 5 | 11.1 | 11.36 | 11.54 | 11.44 | 11.57 | 11.44 | 11.36 | 11.3 |
| 8 | 3.2 | 3.5 | 3.8 | 3.75 | 3.5 | 3.3 | 3.05 | 2.7 |
| 9 | 3.6 | 4.1 | 4.3 | 4.5 | 4 | 3.7 | 3.3 | 3.15 |
| 10 | 4.07 | 4.5 | 4.8 | 5.05 | 4.7 | 4.6 | 4.4 | 4.1 |
| 11 | 5.8 | 6.35 | 6.8 | 6.6 | 6.05 | 6.1 | 5.7 | 5.1 |

TABLE IVb

| | Tb (at %) Content Across Wafer | | | | |
|---|---|---|---|---|---|
| Ex's | 1 | 2 | 3 | 4 | 5 |
| 8 | 15.3 | 15.4 | 15.6 | 15.5 | 15.5 |
| 9 | 15.9 | 16.1 | 16.2 | 16.2 | 16 |
| 10 | 16.4 | 16.6 | 17.3 | 17.4 | 17.2 |
| 11 | 18.2 | 18.2 | 18.3 | 18.5 | 18.3 |

The preceding examples reveal that the performance of the target and properties of the sputtered MO film, as indicated by the yield of elemental rare earth reaching the substrate during the sputtering process, are improved by minimizing the amount of rare earth/transition metal intermetallic compound present in the target. This reduction in intermetallic compound content may be attained by reducing the reactivity of any transition metal in the powder blend, such as by alloying it with another transition metal or other element (e.g., corrosion resistance improving elements). The intermetallic compound content may also be reduced by selecting a powder blend with elemental RE and/or RE/RE alloy powder added in place of some of the finely mixed alloy powder and compensating for the lost transition metal by adding more of the transition metal alloy powder. In addition, limiting the hot pressing temperature and/or time at temperature may also be used to reduce the intermetallic compound content of the target. By optimizing these factors, a target with excellent performance characteristics may be produced. In an effort to produce such a target, the powder blend preferably has greater than about 50 weight percent of its rare earth element content added as an elemental powder with the balance added as a eutectic, or comparable, finely mixed alloy powder, and the transition metal solutes added as an alloy powder. It is believed that for the particular materials used in the preceding examples, and for similar materials, acceptable targets with improved performance may be obtained by using a time, temperature and pressure ranging from about 5 hours at about 400° C., under a pressure of at least about 30 Kpsi (2110 kg/cm$^2$), to about 1 hour at about 800° C., under a pressure of as low as about 2 Kpsi (141 kg/cm$^2$).

From the above disclosure of the general principles of the present invention and the preceding detailed description, those skilled in the art will readily comprehend the various modifications to which the present invention is susceptible. Therefore, the scope of the present invention should be limited only by the following claims and equivalents thereof.

What is claimed is:

1. An alloy target for producing a magneto-optical recording medium, said target having a composition comprising at least one rare earth element and at least one transition metal and having a structure with a transition metal constituent and a finely mixed alloy constituent of a rare earth phase and a rare earth/transition metal intermetallic compound, said target containing up to a maximum of about 15 % by weight of said intermetallic compound, said transition metal constituent being a transition metal alloy and said structure containing substantially no unalloyed transition metal.

2. The target of claim 1 containing up to a maximum of about 10% by weight of said intermetallic compound.

3. The target of claim 1 containing up to a maximum of about 5% by weight of said intermetallic compound.

4. The target of claim 1, the constituents of said structure being bonded together along a bonding interface substantially free of a rare earth/transition metal intermetallic compound diffusion product.

5. The target of claim 1, said structure including a substantially elemental rare earth constituent.

6. The target of claim 1, said structure including an alloy constituent of at least two different rare earth elements.

7. The target of claim 1 said structure including an alloy of at least two different transition metals.

8. The target of claim 1, said structure including a transition metal alloyed with at least one corrosion resistance improving element.

9. The target of claim 1, said finely mixed alloy including a rare earth/transition metal eutectic alloy.

10. The target of claim 1, said finely mixed alloy including a rare earth matrix.

11. An alloy target for producing a magneto-optical recording medium, said target having a composition comprising at least one rare earth element and at least one transition metal and having a structure with a plurality of constituents including a transition metal alloy and a finely mixed alloy of a rare earth phase and a rare earth/transition metal intermetallic compound, said structure containing substantially no unalloyed transition metal, the constituents of said structure being bonded together along a diffusion interface substantially free of a rare earth/transition metal intermetallic compound diffusion product.

12. The target of claim 11, said structure including a substantially elemental rare earth constituent.

13. The target of claim 11, said plurality of constituents including an alloy of at least two different rare earth elements.

14. The target of claim 11, said plurality of constituents including an alloy of at least two different transition metals.

15. The target of claim 11, said plurality of constituents including a transition metal alloyed with at least one corrosion resistance improving element.

16. The target of claim 11 containing up to a maximum of about 15% by weight of said intermetallic compound.

17. The target of claim 11 containing up to a maximum of about 10% by weight of said intermetallic compound diffusion product.

18. The target of claim 11 containing up to a maximum of about 5% by weight of said intermetallic compound.

19. The target of claim 11, said finely mixed alloy including a rare earth/transition metal eutectic alloy.

20. The target of claim 11, said finely mixed alloy including a rare earth matrix.

21. A method of producing an alloy target for forming a magneto-optical recording medium, said method comprising the steps of:
    providing at least one finely mixed alloy constituent of a rare earth phase and a rare earth/transition metal intermetallic compound and at least one transition metal constituent, in particle form;
    mixing the particles to produce a powder blend; and
    subjecting the powder blend to a pressing operation in an oxidizing inhibiting environment for a time and at a temperature and pressure which produces a target having up to a maximum rare earth/transition metal intermetallic compound content of about 15% by weight.

22. The method of claim 21, said target containing up to a maximum of about 10% by weight of said intermetallic compound.

23. The method of claim 21, said target containing up to a maximum of about 5% by weight of said intermetallic compound.

24. The method of claim 21, the at least one transition metal constituent being an alloy, with the powder blend containing substantially no particles of an unalloyed transition metal.

25. The method of claim 24 including providing particles of at least one substantially elemental rare earth metal and mixing the elemental rare earth particles with the particles of the at least one finely mixed alloy and the at least one transition metal alloy to produce the powder blend.

26. The method of claim 24 including providing particles of at least one rare earth/rare earth alloy and mixing the rare earth/rare earth alloy particles with the particles of the at least one finely mixed alloy and the at least one transition metal alloy to produce the powder blend.

27. The method of claim 21, the particles of the at least one finely mixed alloy including a rare earth/transition metal eutectic alloy.

28. The method of claim 21, the particles of the at least one finely mixed alloy including a rare earth matrix.

* * * * *